US012664332B2

(12) United States Patent (10) Patent No.: US 12,664,332 B2
Emiliani et al. (45) Date of Patent: Jun. 23, 2026

(54) METHOD TO REDUCE A VEHICLE PASS-BY NOISE

(71) Applicant: Bridgestone Europe NV/SA [BE/BE], Zaventem (BE)

(72) Inventors: Marco Emiliani, Rome (IT); Gaetano Fortunato, Rome (IT); Vincenzo Ciaravola, Rome (IT)

(73) Assignee: Bridgestone Europe, NV/SA, Zaventem (BE)

( * ) Notice: Subject to any disclaimer, the term of this patent is extended or adjusted under 35 U.S.C. 154(b) by 847 days.

(21) Appl. No.: 18/013,472

(22) PCT Filed: Jul. 5, 2021

(86) PCT No.: PCT/EP2021/068538
§ 371 (c)(1),
(2) Date: Dec. 28, 2022

(87) PCT Pub. No.: WO2022/008459
PCT Pub. Date: Jan. 13, 2022

(65) Prior Publication Data
US 2023/0274052 A1 Aug. 31, 2023

(30) Foreign Application Priority Data
Jul. 7, 2020 (IT) ......................... 102020000016384

(51) Int. Cl.
*G06F 30/20* (2020.01)

(52) U.S. Cl.
CPC ................................... *G06F 30/20* (2020.01)

(58) Field of Classification Search
CPC ...... G06F 30/20; G06F 30/23; G06F 2119/10; Y02T 90/00
USPC .............................................. 703/8
See application file for complete search history.

(56) References Cited

U.S. PATENT DOCUMENTS

| | | | |
|---|---|---|---|
| 2013/0275104 A1* | 10/2013 | Imamura ................. | G06F 30/23 |
| | | | 703/9 |
| 2017/0157997 A1* | 6/2017 | Kyu ................... | B29D 30/0681 |
| 2020/0307319 A1* | 10/2020 | Reichling ........... | B60C 11/1204 |

OTHER PUBLICATIONS

Siemens Technical Info: "What is transfer path analysis", Dec. 31, 2014, XP055568755, Retrieved from the Internet: URL:https://www.plm.automation.siemens.com/en_us/Images/What_is transfer_path_) analysis_tcm1023-220904.pdf.

(Continued)

*Primary Examiner* — Fawaad Haider
(74) *Attorney, Agent, or Firm* — Patterson Intellectual Property Law, PC

(57) ABSTRACT

A simulation method of a vehicle Pass-By Noise (PBN), which method comprises the following steps: (i) providing a tyre model, a vehicle model and one or more sound absorbent material models as inputs to a calculation module; (ii) simulating, by means of the calculation model, a Pass-By noise (PBN) generation profile of one or more rolling tyres based upon the tyre model; (iii) identifying, by means of the calculation module, one or more noise paths at the vehicle body; and (iv) selecting a position and an absorbent material property of an absorbent material to be positioned at vehicle body in order to minimize Pass-By Noise.

7 Claims, 11 Drawing Sheets

INPUTS        PROCESS        OUTPUTS

VEHICLE BODY
MODEL

FEM TIRE
MODEL

FOAM MATERIAL
MODEL

(56) References Cited

OTHER PUBLICATIONS

Wei Yintao et al "A Simulation Methodology for Tire/Road Vibration Noise Analysis" , Proceedings of the 43rd International Congress on Noise Control Engineering, Nov. 16, 2014, XP055787146, Retrieved from the Internet: URL:http://www.acoustics.asn.au/cconference proceedings/INTERNOISE2014.

Shuming Chen et al "Multi-Objective Optimization of Acoustic Performances of Polyurethane Foam Composites" , Polymers, vol. 10, No. 7, Jul. 18, 2018, p. 788, XP055713211, DOI: 10.3390/polym10070788.

Anonymous "Soundproofing—Wikipedia" , Jun. 30, 2020, XP055787393, Retrieved from the Internet: URL:https://en.wikipedia.org/w/index.php?title=Soundproofing&oldid=965354071.

MSC Software: "Webinar—Make your tire noise predictions smarter with acoustic simulation" , YouTube, Mar. 13, 2020 (Mar. 13, 2020), XP054981545, Retrieved from internet: URL: https://www.youtube.com/watch?v=pEh4RjKEbEc.

International Search Authority: International search report for corresponding International patent application No. PCT/EP2021/068538 dated Oct. 20, 2021.

Transfer Path Analysis, The Qualification and Quantification of Vibro-acoustic Transfer Path, Nov. 15, 2012, with English translation, 35 pp.

China Intellectual Property, Chinese Search Report for Application No. 2021800482996, dated Jan. 20, 2026, 2 pages.

Chen, Shuming et al., "Multi-Objective Optimization of Acoustic Performances of Polyurethane Foam Composites," Polymers, Jul. 18, 2018, pp. 1-13, 10, 788; doi: 10.3390/polym10070788.

Msc Software, "Webinar—Make your tire noise predictions smarter with acoustic simulation," Mar. 14, 2020, 5 pp., downloaded from https://www.youtube.com/watch?v=pEh4RjKEbEc.

* cited by examiner

ACOUSTIC
MESH

STRUCTURAL
MESH

◇ ACOUSTIC MESH (STATIONARY)

○ STRUCTURAL MESH AT TIME T'

METHOD TO REDUCE A VEHICLE PASS-BY NOISE

FIELD OF THE INVENTION

The present invention relates to a computer-implemented simulation and designing method to reduce vehicle Pass-By Noise (PBN).

BACKGROUND OF THE INVENTION

Homologation requirements are quite strict in terms of acceptable vehicle Pass-By Noise (PBN).

Meeting such requirements by acting upon tire design implies a generally unsatisfactory compromise in terms of other fundamental performances, e.g. Rolling Resistance coefficient (RRc), behaviour in wet conditions and vehicle handling.

On the other hand, applying noise absorption material upon selected vehicle parts increases the total weight and therefore, again, affects negatively the vehicle performances. Costs are, of course, also increased proportionally to the quantity of the applied sound absorbing material.

To help designers and manufacturers, simulation methods and tools have been developed.

However, many of said methods and tools are based upon very basic modelling of the tire's source of noise, e.g. as a set of monopoles. This simplification does not allow limiting the performance trade-off mentioned above.

In addition, some simulation methods and tools allow assessing acoustic radiation only by using experimental data obtained by testing the tire itself, thus limiting their field of application to existing components only.

SUMMARY OF THE INVENTION

The technical problem underlying the present invention is therefore to overcome at least some of the drawbacks mentioned above with reference to the state of the art.

The above problem is solved by a simulation method according to claim 1. Preferred features of the invention are the object of the dependent claims.

The method of the invention is based upon a combined modelling of the tire, of vehicle body parts and of noise-absorbing material.

Preferably, techniques and tools based upon Finite Element Methods (FEMs) are used.

The simulation method according to the invention allows identifying the most critical noise path(s) at vehicle body level, also in terms of relevant noise frequencies, and selecting accordingly sound absorbing material positioning and properties.

Therefore, the invention allows optimizing the position and properties of noise absorbing material(s) to be applied on the vehicle, in particular at wheel-arch and underbody parts. In this way, dimensions, added weight and cost associated with said material(s) are minimized.

The invention allows reducing PBN without affecting vehicle performances e.g. in terms of Rolling Resistance coefficient (RRc), behaviour in wet conditions and vehicle handling.

In other words, the invention can provide manufacturer with a sound package to be applied to the vehicle which allows reaching high exterior noise absorption levels, while keeping material weight (and consequently costs) low.

Suitable noise absorbing materials to be used in the invention are polyurethane (PU) and Ethylene-Propylene Diene Monomer (EPDM).

Preferred noise frequency ranges of application of the simulation method are within about 500-2000 Hz.

According to a most preferred embodiment, simulation of the noise behaviour of a rolling tire including full tread pattern is used.

The adopted method steps and system components provides for exterior noise simulation of a full pattern rolling tire. In particular, the simulation can include the effects of all pattern features—e.g. lateral slots, sipes, chamfer—and not only grooves as in an axial-symmetric tire model.

In preferred embodiments thereof, the method comprises the three main steps summarized below.

FEM simulation of a rolling tire is performed. Preferably, an explicit FEM simulation is performed on a tire having all construction and pattern features of a realtire. In the simulation environment, the tire is loaded against a reference surface (road or drum) and it is rotated at a desired speed. Reference surface could be either perfectly smooth or including more realistic geometrical features of real asphalts (e.g. micro or macro roughness). Preferably, this simulation is performed in a time domain using a Lagrangian approach. In preferred embodiments, tire is represented by a mesh with nodes and tire vibration is calculated, at each sampled instant of time, for each node that changes position over time. In this way, a vibration map is obtained for each sampled instant of time. In order to distinguish it from the subsequent acoustic simulation step, the FEM simulation of rolling tire will be hereafter defined as 'Structural' simulation and the mesh used as 'structural mesh'. The tire structural mesh is a mesh made of 3D or 2D elements including all the tyre components and features (i.e. from the interior of tire to the external surface—tread—in contact with ground).

A mapping process is performed to allow running acoustic simulation of the subsequent step starting from structural simulation results of the previous step. In fact, considering that most efficient acoustic solvers work in the frequency domain with a stationary mesh (nodes not moving), it is hardly possible to directly use data coming from the structural simulation of the previous step (where nodes are moving over time due to tire rolling).

The mapping process is based upon a customized algorithm which transfers the tire rolling simulation output, i.e. the vibration maps or rolling mesh (i.e. structural mesh), into a non-rolling mesh (hereafter called tire acoustic mesh). Preferably, this step converts vibration from the Lagrangian domain (rolling mesh) into a Eulerian domain (non rolling mesh), the latter being used for acoustic simulation. The tire acoustic mesh is a mesh made of only 2D elements and copying/reproducing (but not necessarily coinciding with) the external layer (or skin) of the tire structural mesh. In specific implementations, the tire acoustic mesh is simplified (e.g. coarser and with smaller detail removed) with a level of resolution (i.e. mesh size) depending upon the frequency range of interest.

Acoustic simulation is performed. The vibration field obtained from the mapping process of the previous step is used as boundary condition of a FEM simulation of the exterior acoustic behaviour of the tire.

The simulation method steps mentioned above allows improving tire by design, rather than replacing physical experimental tests.

Other advantages, features and application modes of the present invention are explained in the following detailed description of specific embodiments, provided by way of example and not with limitative purpose.

BRIEF DESCRIPTION OF THE DRAWINGS

Reference will be made to the figures of the annexed drawings, wherein:

FIG. 7A represents a noise spectrum obtained from an experimental test while

DETAILED DESCRIPTION OF PREFERRED EMBODIMENTS OF THE INVENTION

Figure 1:
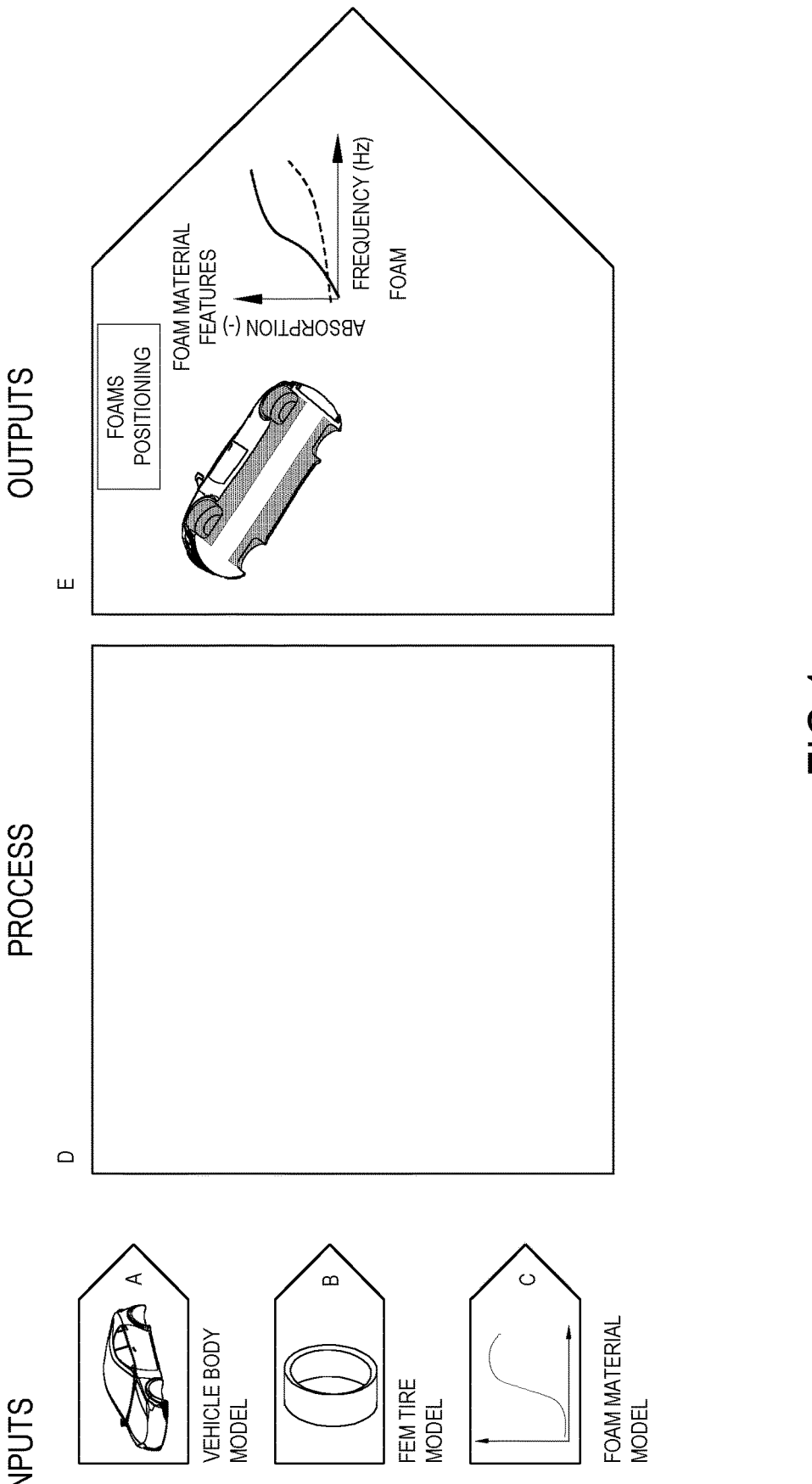
FIG. 1 shows a schematic block representation of a simulation method according to a preferred embodiment of the invention.

With reference to FIG. 1, a simulation method according to a preferred embodiment of the invention receives as inputs:

a vehicle body model, e.g. obtained by existing processes of body scan and meshing;

a tire model, e.g. a FEM model;

a sound-absorbing material model, in particular a foam material, obtained, e.g., by known art material characterization and modelling as expressed also in charts, for example as based upon sound absorption index mapped vs frequency; a plurality of material models may also be inputted, in order to allow the method to select the most appropriate one, possibly also depending upon the application regions.

According to a preferred embodiment, the tire model can be obtained as follows.

Exterior noise of a tire, in particular Pass-By Noise (PBN), is due to vibrations induced by tire/road interaction that convert into noise (vibro-acoustic approach).

According to the invention, acoustic simulation of a rolling tire is performed. In preferred embodiments, the simulation is based upon the following steps.

In a first step, structural simulation of a rolling tire is performed and tirevibration on the exterior tire surface—i.e. at the tire contour—is calculated.

This step can be performed by using Finite Element Methods (FEMs) and Analysis (FEA) tools currently available in the art.

Preferably, this step entails developing or providing a complete tire model, including construction and pattern element geometries. The tire pattern features—e.g. slots, sipes and so on—may make the model non-axialsymmetric and generate (further) vibrations during rolling.

Preferably, the vibration is expressed as velocity, acceleration or displacement of nodes of a mesh.

The result of this step is a vibration model, or map, of the tire, for each sampled instant of time, as explained in detail below.

In the simulation environment, the inflated tire is modelled and loaded on, i.e. associated with, a reference surface, wherein the tire is rotated at a certain speed for a certain time period.

During the simulation time period, the vibration of exteriortire, i.e. the position, speed or acceleration of each node, is stored for each sampled time instant or frame (i.e. time increment of the simulation), wherein the time sampling pitch can be chosen depending upon the frequency range of interest. In this way, a vibration map for each sampled instant of time is obtained.

As said above, the output of this step is a structural model, mesh or vibration map, of a rollingtire, wherein the instant position of each node is defined by the tire structural deformation as deriving from vibration and pressure and load application.

This step may be performed, e.g., by using the Abaqus Explicit® software tool commercially available or by equivalent means. Explicit FEM solver is particularly suited to simulate transient dynamic events such as the periodic tread block impact on ground during tire rolling. Differently from implicit solvers, explicit software solves the equation of motions through time including all the inertial effects and offer many computational advantages with complex non linear problems.

Figure 4:
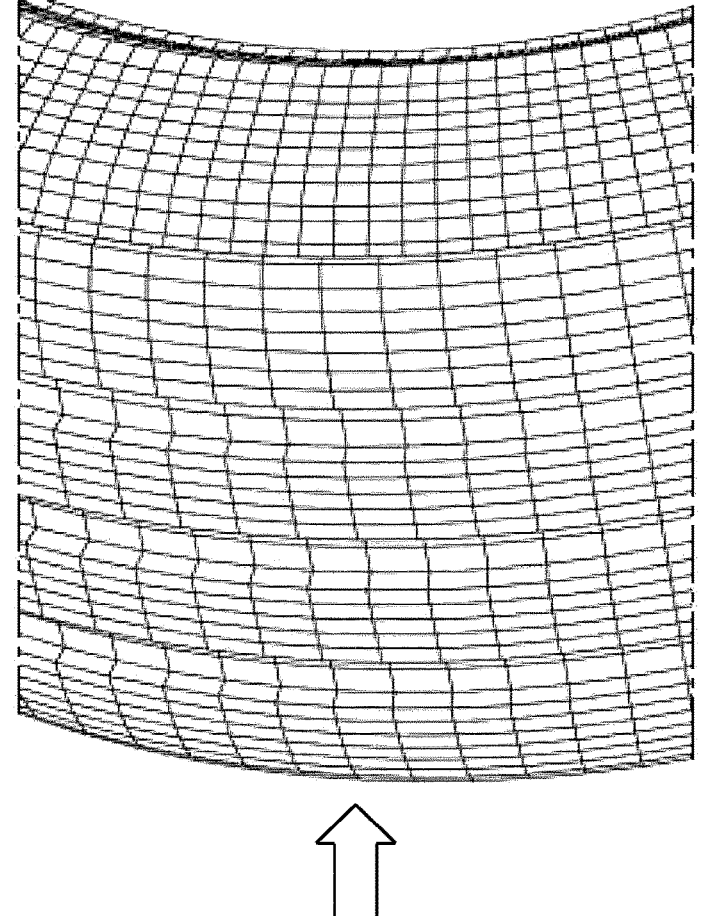
FIG. 4 shows structural and simplified acoustic mesh that are used during a mapping process of a simulation method step according to a preferred embodiment of the invention.
Figure 4:
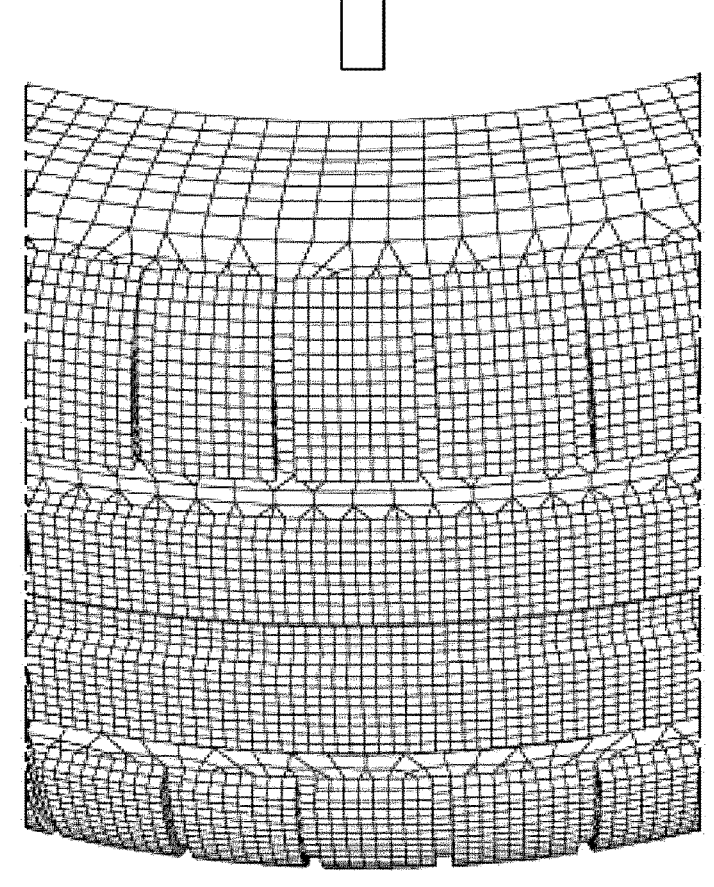

As exemplified in FIG. 4, in a second step the method provides mapping the results from the structural rolling mesh obtained by the above structural simulation step into a (stationary, non rolling) acoustic mesh. Preferably, this step converts the vibration map, i.e. the rolling structural mesh obtained in the first step, from the Lagrangian domain into an Eulerian domain, the latter being subsequently used for noise simulation.

According to preferred embodiments, the mapping is obtained as follows.

A vibration variable of the target acoustic mesh is selected, which variable is preferably chosen among velocity, acceleration and displacement. Velocity and acceleration may be preferred over displacement.

Figure 5:
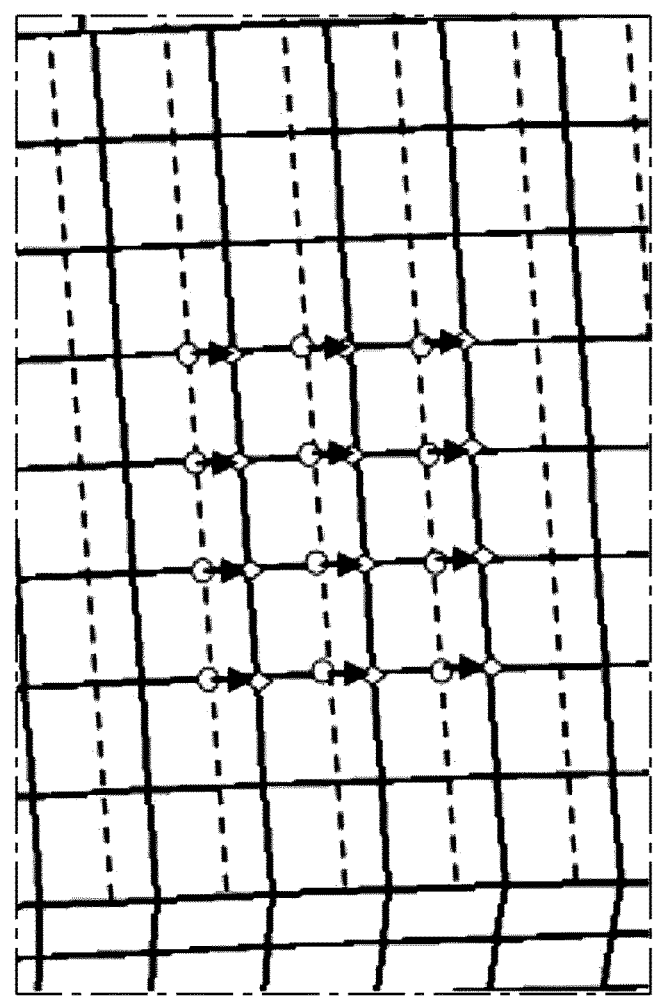
FIG. 5 shows a schematic representation of a specific simulation sub-step according to a preferred embodiment of the invention.

As exemplified in FIG. 5, for each sampled time instant the vibration variable is calculated as follows.

For each target node of the output acoustic mesh, a number of closest nodes of the input structural mesh is selected.

An interpolation between nodes of the structural and acoustic mesh is performed to transfer the vibrational results to the latter mesh. In particular, a weighted average of the vibration variable for the target node is calculated, starting from the values of said variable of the selected closest input nodes.

The number of closest input nodes are in the preferred range of 1 to 8 and an inverse distance weighted interpolation is used:

$$v_j = A \sum_{i=1}^{n} \frac{v_i}{d_{i,j}}$$

wherein:
A=normalization factor
$v_j$=vibration at node j of acoustic mesh
$v_i$=vibration at node i of the structural mesh
$d_{i,j}$=distance between node i of the structural mesh and node j of acoustic mesh.

The numerical method is intended to be applied to a FE model of a real tire having all pattern features (including small pattern features like sipes) leading to a very heavy mesh (with number of nodes/elements >1M)

Interpolation between two meshes (Lagrangian and Eulerian) of such magnitude, to be repeated for all the time step of simulation (depending of sampling frequency but typically >1000-2000 time increment) would became computationally very demanding.

Figure 8:
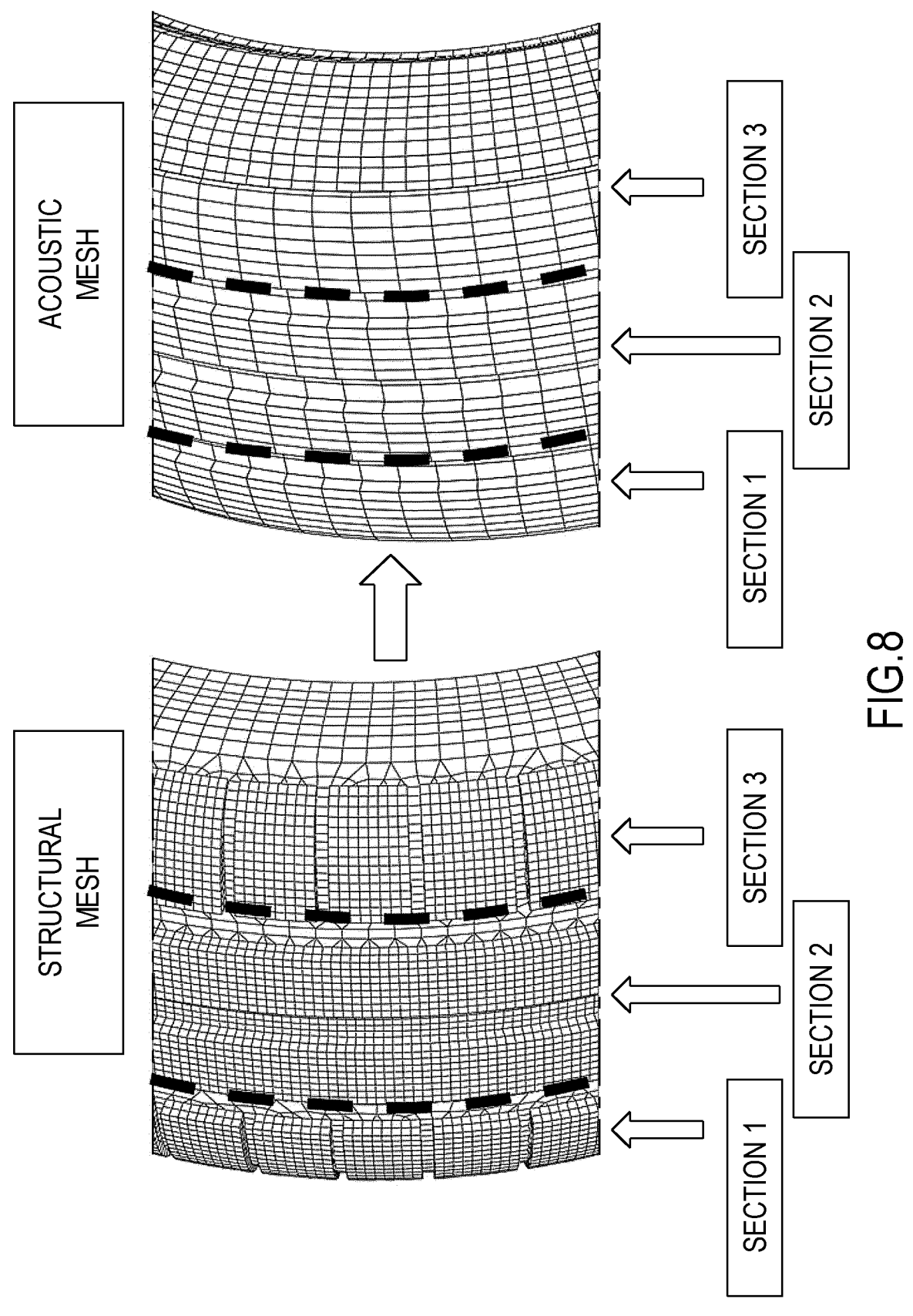
FIG. 8 shows an exemplary subdivision of structural and acoustic tire meshes in lateral section to speed up interpolation during the mapping process of FIG. 1.

In order to reduce computational time both the Lagrangian (input) and Eulerian (target) meshes might be divided into sections in lateral direction (in the range of 2-20 sections) as shown in FIG. 8.

The interpolation is done separately within each corresponding tire section that have a lower number of nodes, drastically reducing the overall computational time.

After repeating the above interpolation process for all time frames, a time history is available for all nodes of the target mesh in conjunction with the respective values of the vibration variable.

Figures 6A, 6B:
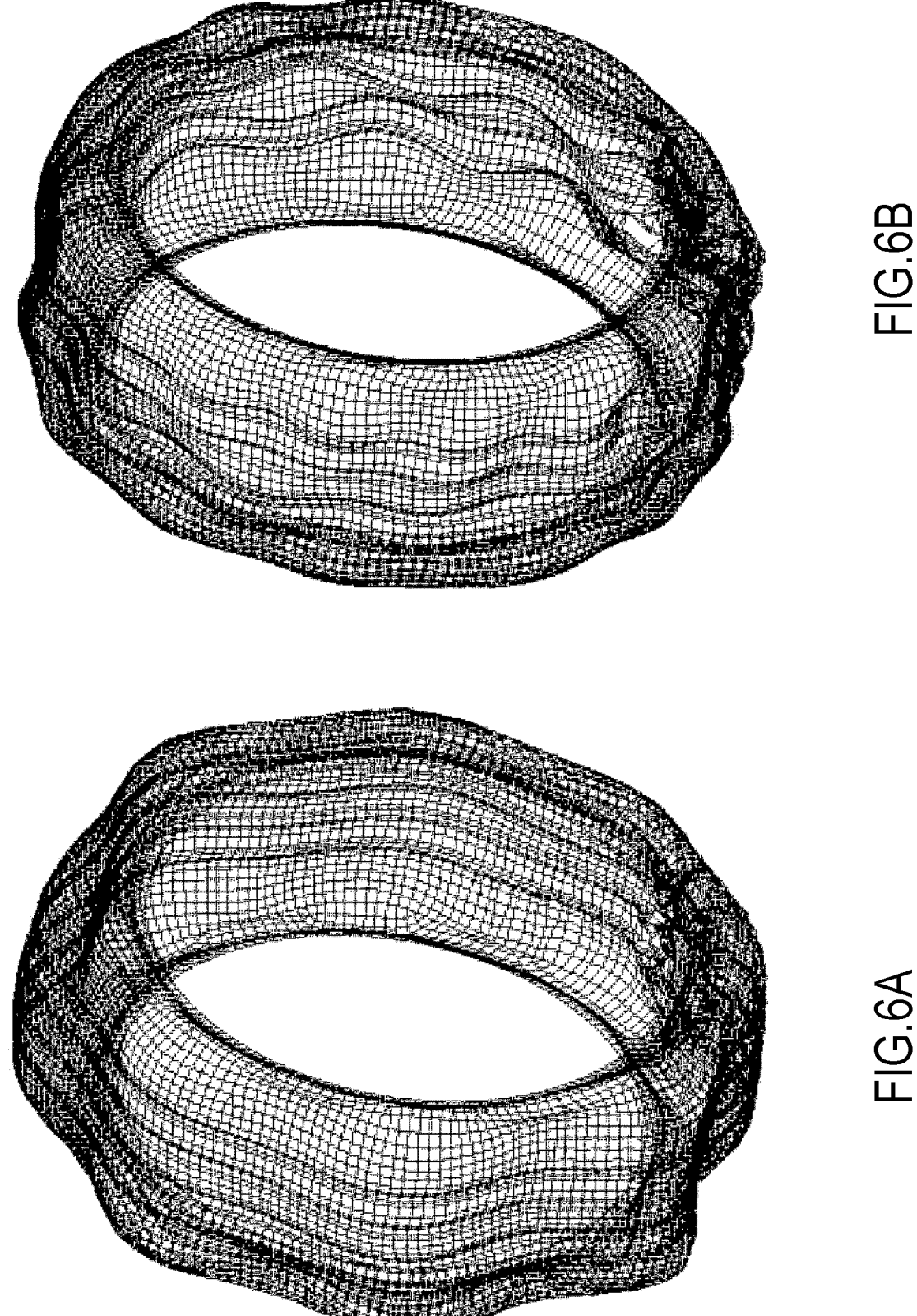
FIGS. 6A and 6B show each a graph representing vibration maps of a tire (in particular the ODS, Operational Deflection Shape) obtained by a preferred embodiment of the invention, at a respective frequency.

For each node, a FFT (Fast Fourier Transform), or equivalent tool, is therefore calculated to have the vibration variable in frequency domain. The result of this step is the tire vibration map (ODS—Operational Deflection Shape) at any specific frequency, as exemplified in the graphs of FIGS. 6A and 6B were the displacement of each node of stationary mesh is represented (in logarithmic scale) for a given frequency band (low frequency band 100-300 Hz in FIG. 6A and high frequency band 400-600 Hz in FIG. 6B).

Preferably, in said step operation in a range of about 20-2000 Hz, preferably 500-2000 Hz, is provided.

In specific embodiments, the acoustic mesh can be a simplified one with respect to mesh size (coarser mesh) and/or pattern elements to be included (e.g. only longitudinal grooves may be modelled). The use of a simplified mesh will reduce computational time with potentially minimum impact on results. In fact, when using lower spatial resolution of acoustic mesh (i.e. less number of nodes and elements) the interpolation and acoustic simulation steps will be faster (while no change of simulation time for structural simulation).

This step can be implemented by Matlab® or any equivalent calculation code or tool.

In a third step, the stationary mesh obtained in the second step is converted into noise, in particular as propagating in a free-field condition, by an acoustic simulation tool. The vibration data as mapped in the second step are used as boundary condition for this acoustic simulation.

The method calculates the acoustic response (Sound Pressure field) in any position of space for each sampled instant of time, thus replicating experimental tests, like those measuring PbN.

This step can be performed by using commercially available acoustic solvers. A preferred tool for this step is based upon acoustic FEM, e.g. using commercially available software such as Siemens VIRTUALLAB®, FFT ACTRAN® or Dassault Systemes WAVE6®. A technique known as PML (Perfectly Matching Layer) may be used for simulating free-field propagation Main advantage of PML use is that only a thin layer of acoustic FEM domain has to be modelled. Alternatively, BEM (Boundary Element Method) tools can be used.

Figure 7A:
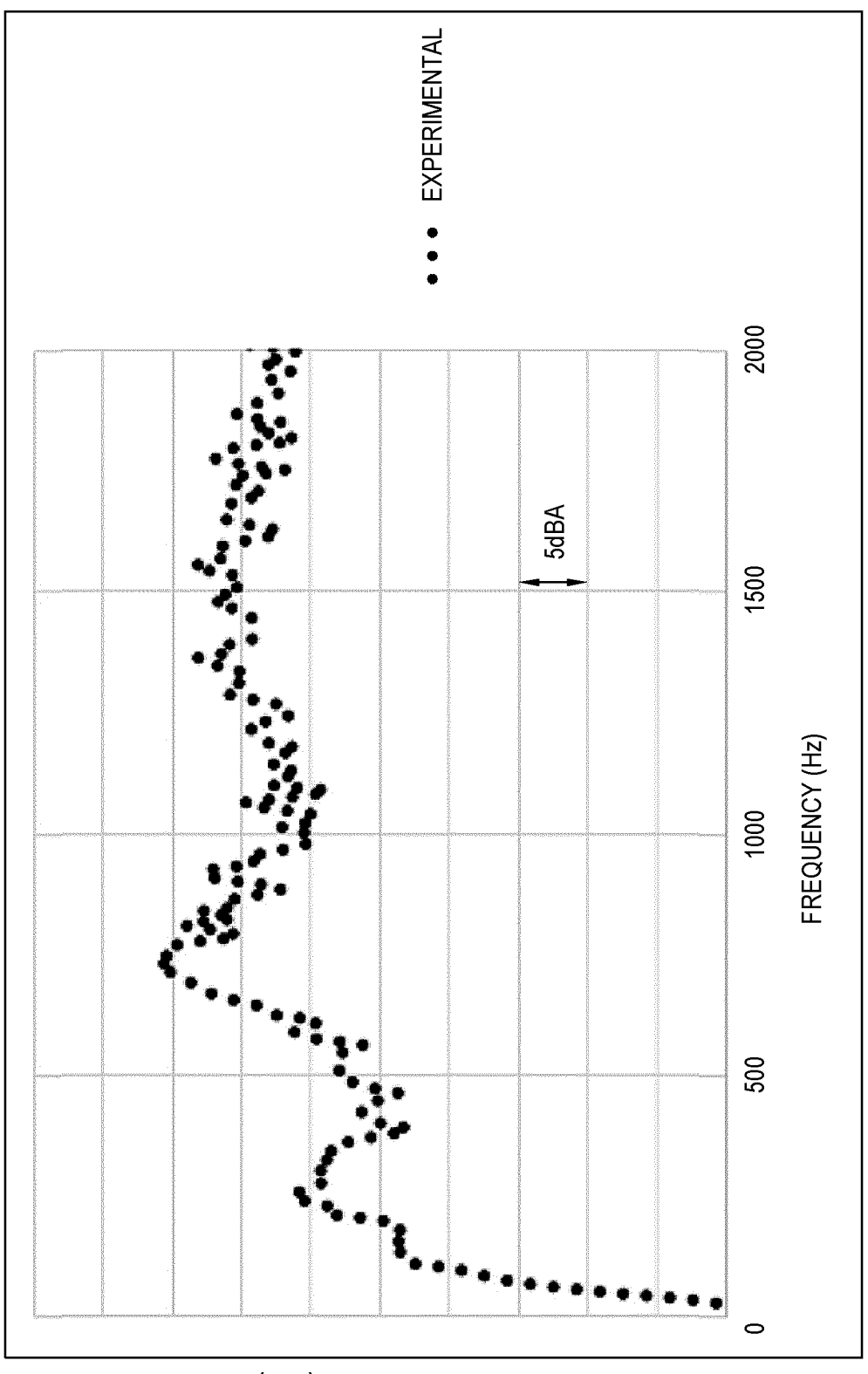
Figure 7B:
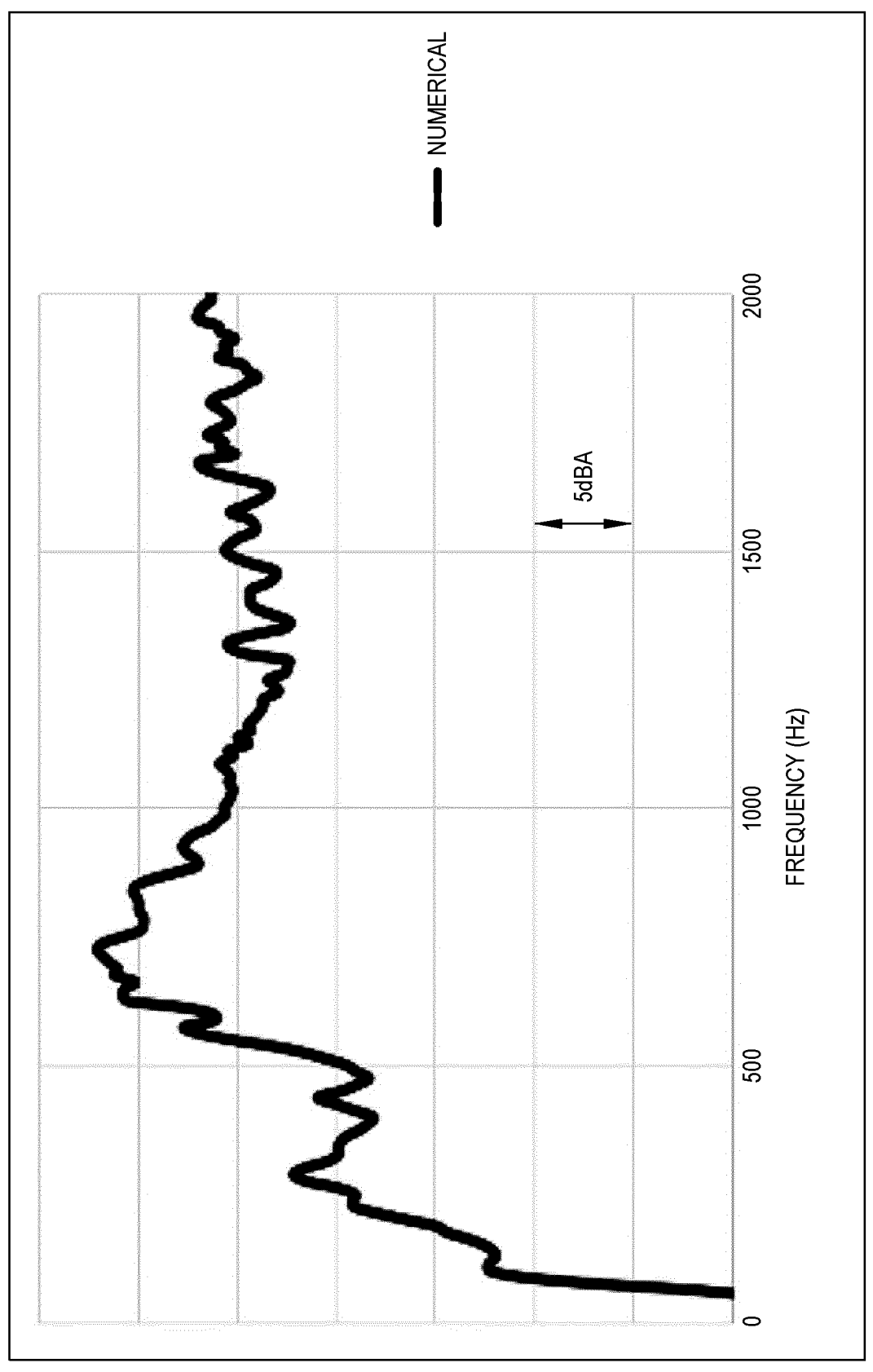
FIG. 7B represents a noise spectrum obtained from an embodiment of the method according to the invention; an objective is to have similar spectral shape so that same noise generation phenomena are represented.

FIGS. 7A and 7B show a graph representing the method performance vs experimental tests. The graph shows a comparison of the Sound Pressure Level (SPL) spectra at 7.5 m from the tire measured with microphones (FIG. 7A—dot line) and simulated with an embodiment of the simulation method according to the invention (FIG. 7B—solid line).

The "Process" box in FIG. 1 indicates the complex of software procedures run upon a computer and implementing calculation algorithms configured for:
    providing noise paths as developing at the vehicle body, e.g. by virtue of transmission, amplification and reflection of the tire acoustic radiation, with particular reference to regions interested by noise levels above a threshold, also as mapped in frequency;
    simulating application of sound absorbing materials with different mechanical and/or physical properties, in particular in terms of frequency-specific absorbance;
    selecting the optimal material position, dimensions and/or properties, based upon a criterion of high absorption at a selected frequency or frequency range and, e.g., low added weight.

As outputs, the simulation method according to the embodiment represented provides absorption material features, in particular:
    absorption material positioning and mechanical/physical properties, particularly in terms of absorbance at a given frequency or frequency range and preferably including material parts thickness gauges.

The user thus receives a preferred scenario defining the positioning of one or more absorption materials at respective vehicle body parts.

Figure 2:
FIG. 2 shows a schematic block representation of an exemplary simulation set-up according to a preferred embodiment of the invention.

FIG. 2 shows schematically an exemplary simulation deck associated with the simulation method of FIG. 1. The set up is mainly composed of the following virtual elements:
    vehicle model, as said above based upon a mesh and including a decomposition in WA and UB components for a sensitivity analysis;
    absorption material model, as defined above;
    tire model for fourtires, each as defined above;
    acoustic simulation profile over the vehicle, preferably with a resolution of 8 Hz;
    measurement points, e.g. simulating microphones, preferably positioned according to bi-dimensional or three-dimensional arrangement.

Test data show that by applying sound absorbing foams on wheel-arch and underbody parts based upon the results of the simulation method allows reducing PBN up to 0.7-1.4 dB, most frequently 1.2-1.4 dB.

In specific simulated cases, by using PU the added weight is about 5-10 kg, while with EPDM the added weight is about 15-25 kg.

Figure 3:
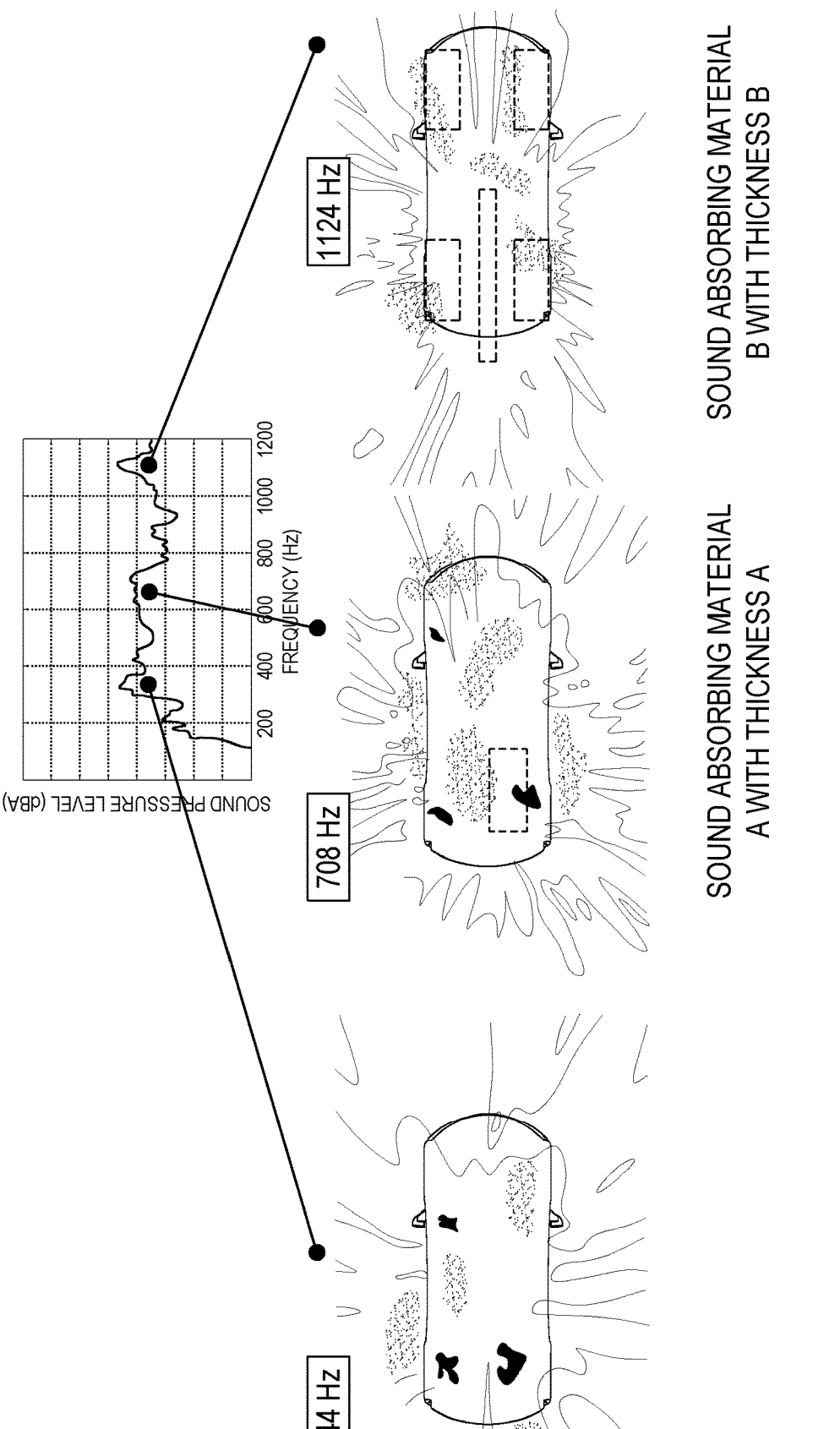
FIG. 3 shows representations from a simulation step of critical noise path identification and subsequent sound absorbing material application.

With reference to FIG. 3, an exemplary result of the simulation is provided in graph form, for three different exemplary noise frequencies. As already in FIG. 1, the absorbent material model is exemplified by a diagram mapping sound absorbance vs sound frequency.

The most critical noise paths are identified, which are represented in FIG. 3 by rectangles at which different absorbent materials are applied. The method simulates the application of various kinds of sound absorbing material different for dimensions, mechanical/physical properties and acoustic absorbance at different frequencies and then selects the best performance according to the criteria expressed above.

Specific Example

Figure 9:
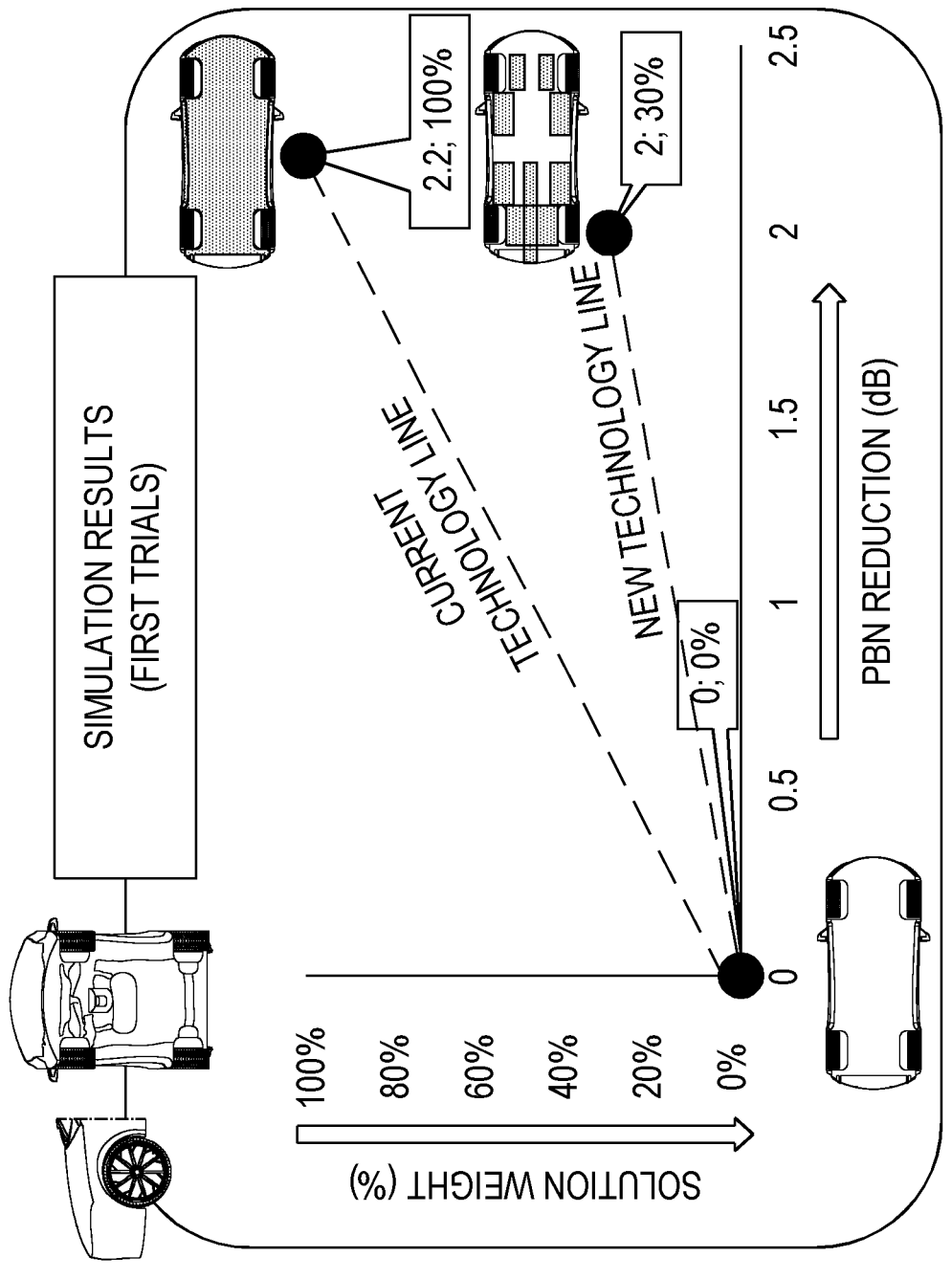
FIGS. 9 and 10 are exemplary representations relating to a specific applicative example of the method of FIG. 1.

To show exemplary results of application of the method according to the invention, we can refer to FIG. 9, wherein results of method application as simulation outputs are reported. Specifically, in the plot we have:

a. On the X axis the PBN Reduction of passenger vehicle;

b. On the Y axis the additional weight of an Underbody and Wheel-arch sound package, featuring parts made of noise absorption materials.

In the plot there are displayed the following items.

a. A Vehicle where no Underbody sound pack is applied, hence there are no PBN savings and no vehicle weight increase (left bottom point at 0,0).

b. A vehicle with an Underbody and Wheel-arch sound pack covering the full available space in the vehicle and wheel-arch underbody region. This configuration mimic the existing commercial solutions and simulating it allows to reduce 2.2 dB vs no underbody sound pack and its weight (additional weight for the vehicle) is referenced as 100% (depending on material type it is around 5 to 10 kg).

c. Finally, it is reported the result of applying the process behind the invention where, as it is possible to see from displayed vehicle underbody, the noise absorption materials are placed only in some specific positions and with specific dimensions and shapes and noise absorption features. It is clear that an optimal positioning allows obtaining similar PBN reduction (2 dB vs 2.2 dB) of full underbody sound pack, but with much less material, in this case only 30% of material vs full underbody sound pack is enough. The positioning and dimensioning of the noise absorption material parts is obtained applying the method as described in conjunction with FIGS. 1 and 3.

Figure 10:
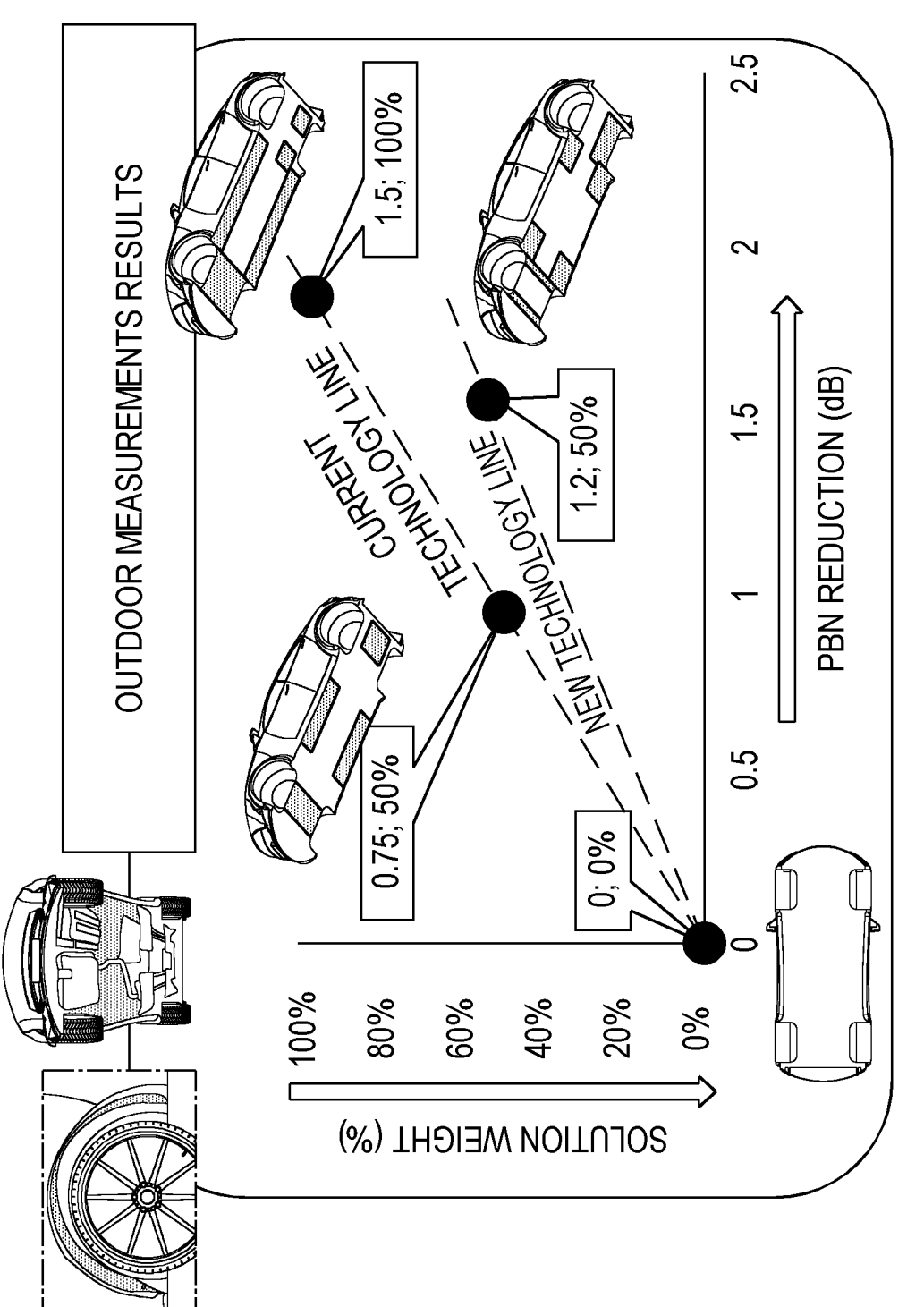

The reliability of the method according to the embodiments of the invention disclosed above, as based on the above simulation deck, is confirmed experimentally, as exemplified in FIG. 10. Here again it is reported:

a. X axis: Measurements of PBN reduction, b. Y axis: Values of the additional weight coming from the underbody and wheel-arch sound pack.

As represented in FIG. 10, measurements involved the following.

a. A vehicle as it is, without featuring noise absorption materials, so this case is represented by 0 PBN reduction and 0 as additional weight 0 the vehicle.

b. A vehicle fully covered by noise absorption materials, placed in all the space allowed by underbody and wheel-arch package. And this case is reproducing the existing commercial solutions. Measurements says that this configuration allows to reduce up to 1.5 dB and is reference 100% for the additional weight, again ranging from 5 to 10 kg of additional weight based on the type of noise absorption material.

c. An underbody and wheel-arch sound pack designed through the method disclosed above, placing the right material, in the right amount and with proper shapes and dimensions. This optimized solution allows reducing up to 1.2 dB, so very close to the 1.5 dB of reference solution by using just half of the materials. So with half weight and possibly having lower costs.

d. Finally, in FIG. 10 another configuration is reported, where still using 50% of noise absorption material vs full coverage, a PBN reduction of only 0.75 dB is obtained. This is the proof that if design of underbody and wheel-arch sound pack is not optimized, PBN reduction keeps remaining just proportional to noise absorption material amount.

The present invention has been described so far with reference to preferred embodiments. It is intended that there may be other embodiments which refer to the same inventive concept as defined by the scope of the following claims.

The invention claimed is:

1. A computer-implemented simulation method of a vehicle Pass-By Noise (PBN), the method comprising:

(i) providing, as inputs to a calculation module:

a tire acoustic model including modelled pattern features comprising one or more of lateral slots, sipes, and chamfers;

a vehicle body part model; and one or more sound absorbent material models;

(ii) identifying, using the calculation module, one or more noise paths at the vehicle body part for each frequency of a predetermined frequency range; and (iii) selecting a position and a material property of a sound absorbent material to be positioned at the vehicle body part in order to minimize Pass-By Noise, wherein step (iii) comprises minimizing Pass-By Noise at one or more frequencies in a range of about 500-2000 Hz, and wherein in step (iii) the selected position of the sound absorbent material is one or more specific locations within a vehicle wheel-arch and/or a vehicle underbody.

2. The method of claim 1, wherein the one or more sound absorbent material models include a model of a foam material, of polyurethane (PU), or of an Ethylene-Propylene Diene Monomer (EPDM).

3. The method of claim 2, wherein step (iii) comprises selecting a combination of different sound absorbing materials.

4. The computer-implemented simulation method of claim 1, provided as part of a vehicle designing method.

5. A vehicle manufacturing method, comprising:

(i) providing, as inputs to a calculation module:

a tire acoustic model including modelled pattern features comprising one or more of lateral slots, sipes, and chamfers;

a vehicle body part model; and one or more sound absorbent material models as inputs to a calculation module;

(ii) identifying, using the calculation module to perform an acoustic simulation based on the tire acoustic model and the vehicle body part model, with vibration data of the tire acoustic model as boundary conditions, one or more noise paths at the vehicle body part for each frequency in a range of about 500-2000 Hz;

(iii) selecting one or more positions within a vehicle wheel-arch and/or underbody and a material property of a sound absorbent material to be positioned in the selected one or more positions in order to minimize Pass-By Noise; and (iv) applying sound absorbing material having the selected material property in the selected one or more positions, such that a material weight is minimized, without affecting vehicle performances in terms of Rolling Resistance coefficient (RRc), behaviour in wet conditions, and vehicle handling.

6. The vehicle manufacturing method of claim 5, wherein the one or more sound absorbent material models include a model of a foam material, of polyurethane (PU), or of an Ethylene-Propylene Diene Monomer (EPDM).

7. The vehicle manufacturing method of claim 6, wherein the step (iii) comprises selecting a combination of different sound absorbing materials.

\* \* \* \* \*